United States Patent [19]

Awane et al.

[11] Patent Number: 4,801,351

[45] Date of Patent: Jan. 31, 1989

[54] METHOD OF MANUFACTURING MONOCRYSTALLINE THIN-FILM

[75] Inventors: Katunobu Awane, Ikoma; Masayoshi Koba, Nara; Toshiaki Miyajima, Ikoma; Masashi Maekawa, Nara, all of Japan

[73] Assignee: Agency of Industrial Science and Technology, Tokyo, Japan

[21] Appl. No.: 943,428

[22] Filed: Dec. 19, 1986

[30] Foreign Application Priority Data

Dec. 20, 1985 [JP] Japan .................................. 60-285438
Mar. 28, 1986 [JP] Japan .................................. 61-68554
Sep. 26, 1986 [JP] Japan .................................. 61-225900

[51] Int. Cl.⁴ .............................................. C30B 1/08
[52] U.S. Cl. ................................. 156/603; 156/616.1; 156/616.2; 156/616.3; 156/DIG. 86; 156/DIG. 64; 427/53.1; 427/376.2
[58] Field of Search ........... 156/603, 604, 612, 616 N, 156/DIG. 64; 427/86, 53.1, 376.2, 264, 265, 93

[56] References Cited

U.S. PATENT DOCUMENTS

| | | | |
|---|---|---|---|
| 4,383,883 | 5/1983 | Mizutani | 156/603 |
| 4,448,632 | 5/1984 | Akasaka | 156/DIG. 64 |
| 4,487,639 | 12/1984 | Lam et al. | 427/86 |
| 4,555,300 | 11/1985 | Arnold et al. | 156/DIG. 64 |
| 4,565,584 | 1/1986 | Tamura et al. | 156/603 |
| 4,565,599 | 1/1986 | Geis et al. | 156/603 |
| 4,651,407 | 8/1987 | Bencuya | 156/612 |
| 4,651,408 | 3/1987 | MacEwee et al. | 156/612 |
| 4,678,538 | 7/1987 | Hoand et al. | 156/603 |

OTHER PUBLICATIONS

Jadus et al., IBM Technical Disclosure Bull., vol. 14 (7), Dec. 1971.

Tamura et al., Jap. J. Appl. Physics, vol. 19, pp. L23-26, (1980).

Primary Examiner—Asok Pal
Attorney, Agent, or Firm—Birch, Stewart, Kolasch & Birch

[57] ABSTRACT

Improvements in a method for performing a monocrystallizing operation through the application of energy beams upon a non-monocrystalline thin-film of non-crystalline or polycrystalline material formed on a non-crystalline insulating film. The resulting superior monocrystalline thin-film has a crystal direction coinciding with that of the monocrystalline silicon base-plate and is formed on the insulating film even if the insulating film is as thick as 4 μm. The thin-film is sufficiently covered between the active layers of a three-dimensional circuit element on the monocrystalline silicon base plate.

14 Claims, 4 Drawing Sheets

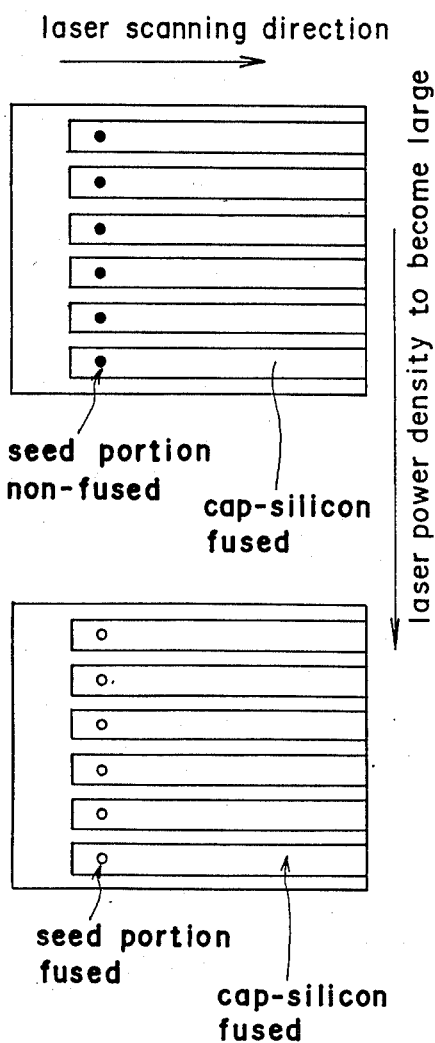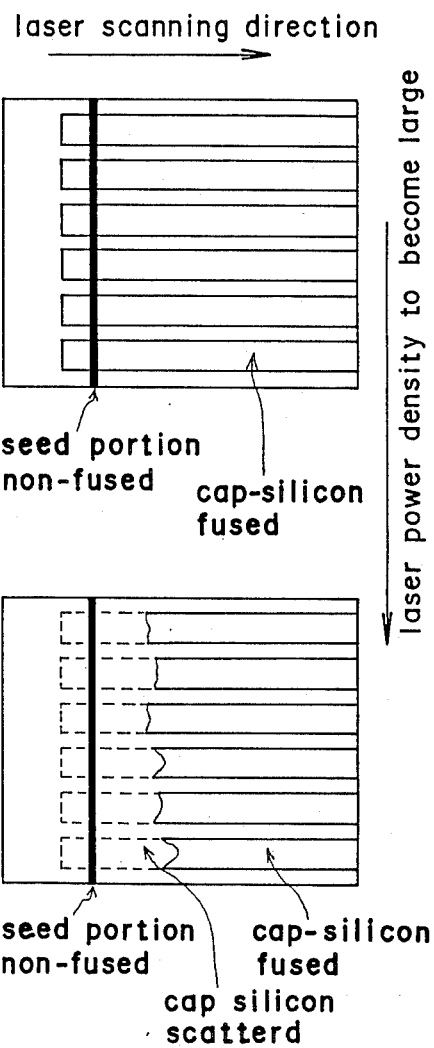

METHOD OF MANUFACTURING MONOCRYSTALLINE THIN-FILM'

BACKGROUND OF THE INVENTION

The present invention relates to a method of manufacturing monocyrstalline thin films to be used in areas of semiconductor apparatus manufacturing, and more particularly, to improvements in a method of performing a monocrystallizing operation or single crystallizing operation, through the application of energy beams to a non-monocrystalline thin film such as a non-crystalline or amorphous or polycrystalline film formed on a non-crystalline insulation film.

A conventional method of manufacturing a mono-crystalline thin film on a monocrystalline silicon base plate having a crystal direction coinciding therewith has been proposed. This method includes forming a non-crystalline or polycrystalline thin film on an insulating film which is formed on a monocrystalline silicon base-plate, i.e. a substrate, a performing a molten-recrystallizing operation by the application of energy beams on the thin film.

According to the conventional method, when the thickness of the insulating film is increased between the monocrystalline silicon base-plate and the non-crystalline or polycrystalline thin film to be monocrystallized, the monocrystalline or polycrystalline thin film near the insulating film flows into the insulating film when it is melted through the application of the energy beams causing the non-crystalline or polycrystalline thin-film to become thinner near the insulating film. Thus, crystal growth is not continuously conducted from the non-crystalline or polycrystalline thin film in the region which is in contact against the monocrystalline silicon base-plate and into the non-crystalline or polycrystalline thin film on the insulating film.

Also, if the insulating film increases in thickness and the size becomes larger with the monocrystalline silicon base-plate being stripe-shaped in form, the monocrystalline silicon base-plate and the base plate on the insulating plate largely differ in thermal conduction. The considerable temperature difference is caused in the non-crystalline or polycrystalline thin-film during the application of the energy beams so that the superior monocrystalline thin film is not provided. FIG. 6 shows a case where the form of the monocrystalline silicon base-plate is stripe-shaped or dot-shaped in a known manner. It has been determined that a superior molten condition is not provided in this case of the stripe-shaped base-plate.

SUMMARY OF THE INVENTION

Accordingly, an object of the present invention is to provide a method of manufacturing a monocrystalline thin film, so as to form the monocrystalline thin film while controlling crystal direction and so as to form a thin film superior in quality through the application of energy beams.

In order to solve the conventional art problems, the method of manufacturing a monocrystalline thin-film according to the present invention includes the steps of forming an exposed portion of a monocrystalline silicon base-plate which is covered with a non-crystalline or polycrystalline insulating film, the exposed portion being rectangular or almost circular in shape such as a dot-shape, scanning energy beams onto the exposed portion of the non-crystalline or polycrystalline thin-film continuously formed on the monocrystalline silicon base-plate exposed portion and the insulating film to provide a monocrystalline thin-film the crystal direction of which coincides with that of the monocrystalline silicon base-plate.

It is preferable that the size of the exposed portion in the insulating film is 4 $\mu$m square (or 4 $\mu$m in diameter) or less and that the insulating film exposed portion is buried in advance with the material to be mono-crystallized.

When the energy beams are applied upon the non-crystalline or polycrystalline thin-film formed on the insulating film and applied upon the non-crystalline or polycrystalline thin-film buried in the monocrystalline silicon base-plate exposed portion, the temperature is likely to rise in the non-crystalline or polycrystalline thin-film formed on the insulating film if the thermal conductivity of the absolute film is smaller than the thermal conductivity of the non-crystalline or polycrystalline thin film buried in the monocrystalline silicon base-plate exposed portion. When the exposed portion of the monocrystalline silicon base-plate is stripe-shaped or is more than 4 $\mu$m square in size, the amount of the heat that escapes to the base plate through the non-crystalline or polycrystalline thin-film with the insulating-film exposed portion buried therein becomes large so that the non-crystalline or polycrystal thin-film on the exposed portion becomes difficult to melt. When the power density of the energy beams is raised until the non-crystalline or polycrystalline thin film on the opening portion is melted, scattering is caused in the non-crystalline or polycrystalline thin-film on the insulating film. Such a problem as described above becomes more considerable when the insulating film to be formed on the monocrystalline silicon base-plate has a larger thickness. In a three-dimensional circuit element with elements such as transistors or the like being constructed from many layers, the insulating film thickness between the respective active layers becomes as thick as 2 to 4 $\mu$m or more.

In the present invention, the configuration of the insulating-film exposed portion is formed to be square or almost circular as in a dot shape and the size thereof is 4 $\mu$m or less, so that the amount of heat escaping into the base plate through the exposed portion is reduced. Thus, the difference between the temperature of the non-crystalline or polycrystalline thin-film on the exposed portion and the temperature of the non-crystalline or polycrystalline thin-film on the insulating film is reduced through the thermal conduction from the periphery so as to simultaneously melt both portions of the non-crystalline or polycrystalline thin film without causing scattering.

Also, in accordance with the present invention the insulating film exposed portion is filled in advance with a piece of the non-crystalline or polycrystalline thin film. The molten thin-film flows into the insulating film exposed portion from the periphery of the exposed portion during the application of energy beams to prevent the non-crystalline or polycrystalline thin-film from becoming thinner so that the crystal growth of the monocrystalline thin-film is conducted continuously on the insulating film from the insulating film exposed portion.

Accordingly, monocrystals may be grown from the monocrystalline silicon base-plate exposed portion stably even if the insulating film increases in thickness through the above-described operation.

BRIEF DESCRIPTION OF THE DRAWINGS

These and other objects and features of the present invention will become apparent from the following description taken in conjunction with the preferred embodiment thereof with reference to the accompanying drawings, in which:

FIGS. 6(a) and 6(b) show views for illustrating the molten condition between the dot shape and the stripe shaped used in an insulating-film based on the employment of a conventional method.

DETAILED DESCRIPTION OF THE INVENTION

Figure 1A:
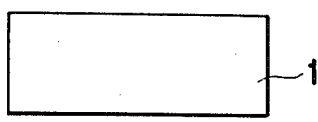
FIGS. 1(a) through 1(i) are respectively process charts showing sample sections for illustrating a method of manufacturing a monocrystalline thin-film in accordance with one embodiment of the present invention.

Referring now to the drawings, there are shown process charts for illustrating one embodiment of the present invention in FIGS. 1(a) through 1(i).

Figure 1B:
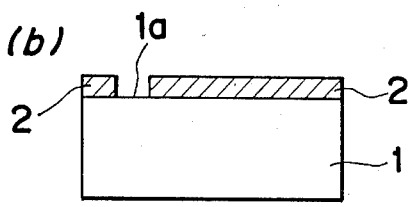
Figure 2:
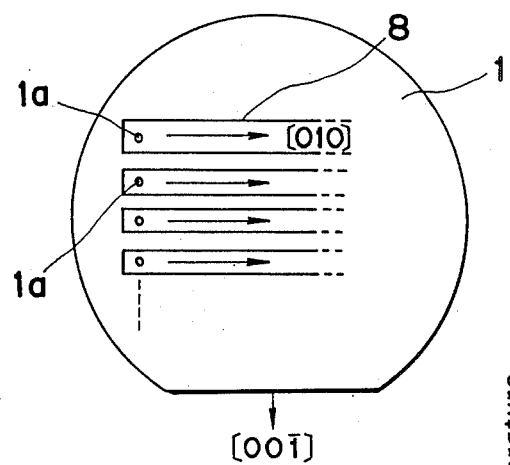
FIG. 2 is a view for illustrating the formation direction, i.e. crystal growth direction, of the stripe-shaped thin film upon the application of the method of the present invention.

First, an insulating film 2 of non-crystalline material is formed on a top plane of a (100) monocrsytalline silicon base-plate 1 which is partially exposed to provide an exposed portion 1a, as shown in FIG. 1(b), of the monocrystalline silicon base-plate 1, as shown in FIG. 1(a). At this time, the size of the monocrystalline silicon base-plate exposed portion is assumed to be 3 $\mu$m square. As a concrete example, a SiO$_2$ film of 2 $\mu$m in thickness is first formed on the monocrystalline silicon base-plate 1 by means of, for example, a known thermal oxidation method. Thereafter, the monocrystalline silicon base-plate 1 of the SiO$_2$ film is selectively etched by a known photo-etching method only at the portion to be exposed to form a plurality of exposed portions 1a, 1a, 1a, etc., having dot shapes, and each being 3 $\mu$m square at intervals of 15 $\mu$m, as shown in FIG. 2.

Figure 1C:
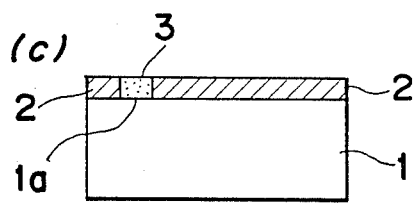

Then, a piece of non-crystalline or polycrystalline silicon thin film 3 which is almost equal in thickness to the insulating film 2, as shown in FIG. 1(c), is embedded only in the exposed portion 1a of the monocrystalline silicon base-plate 1 provided in and surrounded by the insulating film 2. As a concrete example, either non-crystalline silicone thin-film or polycrystalline silicon thin-film is formed by a known LPCVD method on the whole surface of the insulating film 2 including the exposed portion 1a. Then organic application film material is applied by painting so as to evenly cover the whole surface of the non-crystalline or polycrystalline silicon thin-film, which is formed unevenly on the surface corresponding to the exposed portion 1a of the monocrystalline silicone base-plate 1 and the surface of the insulating film 2, to form an organic application film. Thereafter, equal-speed etching is performed on the surface of the organic application film surface to transform the even surface of the initial organic application film, and the etching operation is stopped at a point in time when the insulating film 2 has been exposed with the filled non-crystalline or polycrystalline silicon thin-film 3 in the exposed portion 1a of the insulating film 2, as shown in FIG. 1(c).

It is noted that, upon the completion of the etching, the difference in surface thickness between the non-crystalline or polycrystalline silicon thin film 3 which is filled in at this time, and the insulating film 2 is assumed to be 1 $\mu$m or less.

Figure 1D:
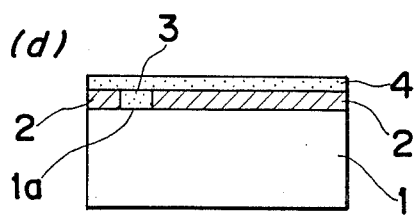
Figure 1E:
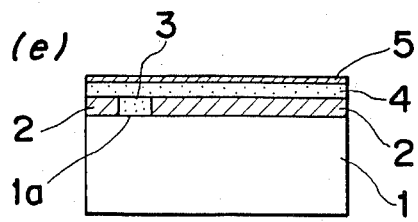

In the next step, a non-crystalline or polycrystalline silicon thin film 4 which becomes an active layer of 0.6 $\mu$m in thickness is formed by the LPCVD method on both the upper filled portion of the thin film 3 and the upper portion of the insulating film 2, as shown in FIG. 1(d). Furthermore, an SiO$_2$ film which serves as a surface protective film, i.e. anti-reflective film 5, for the silicon thin film 4 is formed by the APCVD method, this SiO$_2$ film being 850 Å in thickness over the whole surface of the silicon thin film 4, as shown in FIG. 1(e).

Figure 1F:
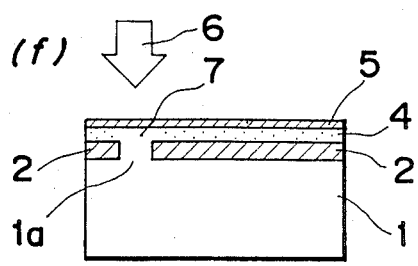

Next, laser beams 6 to 60 $\mu$m in molten width and 10 W in power are applied to the region including the monocrystalline silicon base-plate filled portion 1a, as shown in FIG. 1(f), and the non-crystalline or polycrystalline thin-film 4 on the monocrystalline silicon base-plate exposed portion 1a is caused to mono-crystallize with the monocrystalline silicon base-plate exposed portion 1a which is used as a seed for mono-crystallization, so that a monocrystalline thin-film 7 is obtained having a crystal direction coinciding with that of the monocrystalline silicon base-plate 1.

Figure 1G:
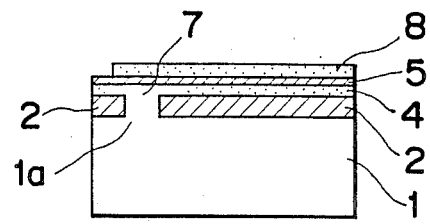
Figure 1H:
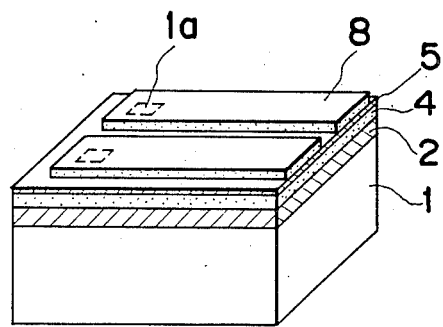

Then, a non-crystalline or polycrystalline silicon thin-film 8 having a stripe shape is formed on the surface of the surface protective film 5, as shown in FIGS. 1(g) and 1(h) in a longitudinal direction of the stripe so as to become (010) with respect to the monocrystalline silicon base plate 1, as shown in FIG. 2. As a concrete example, the non-crystalline or polycrystalline silicon thin film 8 is formed 0.6 $\mu$m in thickness by using the LPCVD method on the surface protective film 5, and is made stripe-shaped through selective etching operation by a known photo-etching method. At this time, each stripe of the non-crystalline or polycrystalline silicon thin film 8 is formed to cover the monocrystalline silicon base-plate exposed portion 1a with a stripe width of 10 $\mu$m, the interval between the stripes being 5 $\mu$m.

Figure 1I:
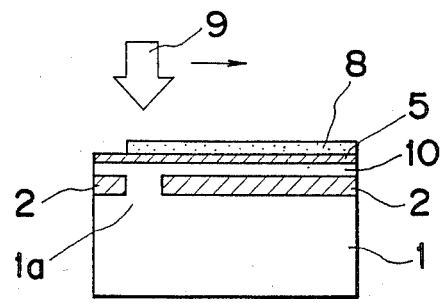
Figure 3B:
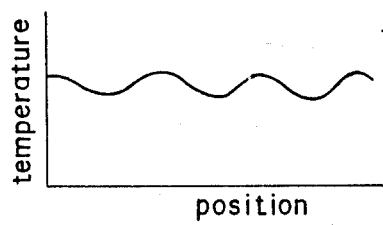
FIGS. 3(a) and 3(b) show a principle chart for illustrating a method of controlling the reflection factor to provide a given temperature distribution to be employed in the method of the present invention.
Figure 3A:
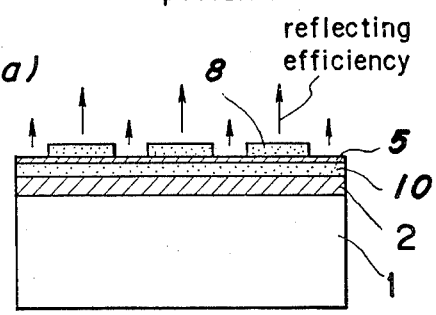

Finally, the scanning operation of the laser beam 9 of 60 $\mu$m in molten width and 12 W in power is conducted on the monocrystalline silicon base-plate exposed portion 1a with a scanning speed of 100 mm per second in the longitudinal direction of the stripe-shaped non-crystalline or polycrystalline silicon thin-film 8, as showing FIG. 1(i), to provide a monocrystalline silicon thin film 10 in which the non-crystalline or polycrystalline silicon thin-film 4 is mono-crystallized with the filled silicon 7 coincided with the monocrystal silicon base-plate 1 in the crystal direction being provided as the seed. With the above process, the monocrystalline silicon thin-film 10 coinciding (100) with the monocrystaline silicon base-plate 1 in the crystal direction is finally obtained on the surface of the insulating film 2. It is noted that the reason why the stripe-shaped non-crystalline or polycrystalline silicon thin-film 8 is formed is that the reflection factor, i.e. the reflectivity of the laser beam 9, in the place where the stripe-shaped silicon is located is enlarged to be greater than that in the place where the strip-shaped silicon does not exist, as shown in FIG. 3(a), the solidification for monocrystallization starts from under the stripe-shaped silicon central portion with a temperature distribution being provided, as shown in FIG. 3(b), and the monocrystalline growth of the silicon thin film 10 is caused by the monocrystalline silicon base-plate exposed portion 1a used as the seed.

Figure 4:
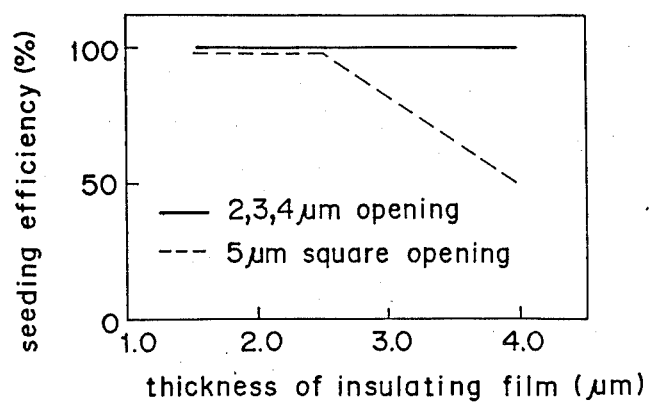
FIG. 4 is a chart showing the influence of the size of the insulating-film exposed portion with regard to the seeding efficiency in the method of the present invention.

The change of the seeding efficiency of the seed due to changes in the insulating film 2 thickness and the size of the insulating film exposed portion 1a is examined for comparison, with the result shown in FIG. 4. When the opening of the exposed portion 1a is as large as 5 μm square, the seeding efficiency is lowered if the insulating film 2 becomes as thick as 4 μm. Also, when the exposed portion 1a is 2 μm, 3 μm or 4 μm square, the seeding efficiency is not seen to drop if the thickness of the insulating 2 film is made 4 μm in thickness. In a three-dimensional circuit element, the exposed portion 1a will do well if it is made 4 μm square or less in size, because even the largest thickness between the respective active layers is about 4 μm.

Figure 5:
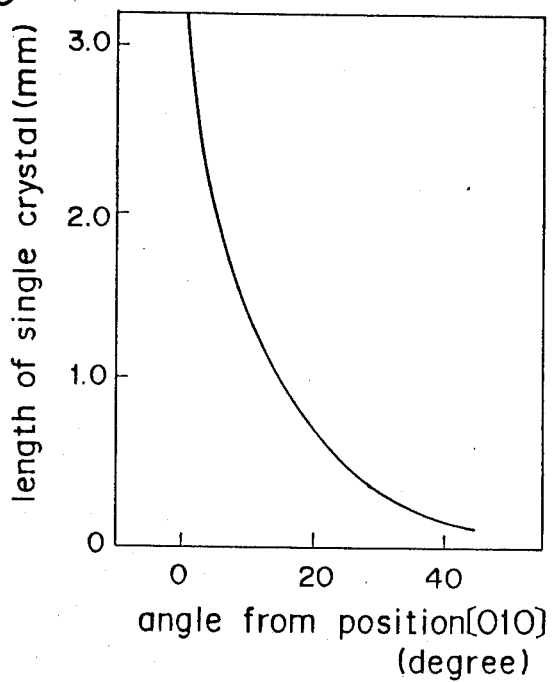
FIG. 5 is a chart showing the relationship between the laser scanning direction and the length of a single crystal wherein the monocrystalline region is enlarged from the seed portion as in the method of the present invention.

Also, it is to be noted that the reason why the crystal face of the (100) is used as the monocrystalline silicon base-plate 1, and the laser scanning direction is along the (010) is that it is most difficult for a crystal defect to form with the combination of (100) and (010), and the monocrystalline region may be smoothly enlarged from the seed portion. The length for which the monocrystalline region extends from the seed portion when the laser scanning direction is varied between (010) and (011) by the use of (100) monocrystalline silicon base plate 1 that is used as shown in FIG. 5. It is most desirable from FIG. 5 that the laser scanning in the (010) direction is used. To enlarge the (100) crystal to the (010) is best even in comparison with the case in which the other crystal face is used. Superior results are similarly provided even if the (100) crystal of the symmetrical face equivalent to the (100) crystal is enlarged in the equivalent direction <100>.

As is clear from the foregoing description, according to the present invention, a superior monocrystalline silicon thin-film having a crystal direction coinciding with that of a monocrystalline silicon base plate is formed on an insulating film even if the insulating film is as thick as 4 μm. The thin-film is sufficiently covered between the active layers of a three-dimensional circuit element on the monocrystalline silicon base plate.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A method of manufacturing a monocrystalline thin film which comprises the steps of:
    forming a non-crystalline insulating film on a monocrystalline silicon base-plate so as to provide an opening in said insulating film which corresponds to an exposed portion of said monocrystalline silicon base-plate, said exposed portion being formed in a circular or rectangular shape;
    filling said exposed portion with non-monocrystalline material, which is to be monocrystallized so as to form a filled portion;
    forming a thin film of non-monocrystalline material to be monocrystallized on said insulating film,
    forming a surface protective film on said thin film,
    applying first energy beams to said filled portion so as to transform said non-monocrystalline material of said filled portion into monocrystalline material having a crystal direction which coincides with that of said silicon base-plate, wherein said exposed portion of said monocrystalline silicon base-plate acts as a seed,
    forming a stripe-shaped silicon film cover on said surface protective film so as to cover said filled portion, and
    applying second energy beams to said thin film so as to transform said non-monocrystalline material of said thin film into monocrystalline material having a crystal direction which coincides with that of said silicon base-plate so as to manufacture said monocrystalline thin film, wherein said filled portion acts as a seed.

2. The method according to claim 1, wherein said non-monocrystalline material which is to be monocrystallized is non-monocrystalline silicon.

3. The method according to claim 2, wherein the size of said exposed portion is 4 microns or less measured as a diameter of a circle or a side of a rectangle.

4. The method according to claim 2, wherein a plurality of exposed portions which act as seeds are formed, and a plurality of stripe-shaped silicon film covers are formed so as to correspond with said plurality of exposed portions.

5. The method according to claim 1, wherein the crystal face of said monocrystalline silicon base-plate is {100}, and the direction of said stripe-shaped silicon film covers is <100>.

6. The method according to claim 4, wherein the crystal face of said monocrystalline silicon base-plate is {100}, and the direction of said stripe-shaped silicon film covers is <100>.

7. The method according to claim 1, wherein the crystal face of said monocrystalline silicon base-plate is {100}, and the scanning direction of said energy beams is <100>.

8. The method according to claim 4, wherein said non-monocrystalline silicon is non-crystalline or polycrystalline silicon.

9. The method according to claim 8, wherein said insulating film and said surface protective film comprise $SiO_2$, and wherein said stripe-shaped silicon film cover comprises non-crystalline or polycrystalline silicon.

10. The method according to claim 9, wherein said exposed portion is formed in a circular shape.

11. The method according to claim 9, wherein said exposed portion is formed in a square shape.

12. The method according to claim 9, wherein the crystal face of said monocrystalline silicon base-plate is {100}, the scanning direction of said energy beams is <100>, and said energy beams comprise laser beams.

13. The method according to claim 12, wherein said non-crystalline insulating film is formed by thermal oxidation, said exposed portion is formed by selective etching, said filled portion and said thin film are formed by LPCVD, said surface protective film is formed by APCVD, and said stripe-shaped silicon film cover is formed by LPCVD.

14. The method according to claim 12, wherein said monocrystalline thin film is incorporated into a three-dimensional circuit element.

* * * * *